United States Patent
Sawada et al.

(10) Patent No.: US 8,981,221 B2
(45) Date of Patent: Mar. 17, 2015

(54) WIRING HARNESS ARRANGEMENT STRUCTURE

(75) Inventors: Masashi Sawada, Yokkaichi (JP); Tadayoshi Asao, Yokkaichi (JP); Koki Shiga, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 13/574,891

(22) PCT Filed: Oct. 28, 2010

(86) PCT No.: PCT/JP2010/069138
§ 371 (c)(1),
(2), (4) Date: Jul. 24, 2012

(87) PCT Pub. No.: WO2011/108141
PCT Pub. Date: Sep. 9, 2011

(65) Prior Publication Data
US 2012/0312595 A1    Dec. 13, 2012

(30) Foreign Application Priority Data
Mar. 2, 2010 (JP) .................................. 2010-045934

(51) Int. Cl.
*H02G 3/04* (2006.01)
*B60R 16/02* (2006.01)
*H05K 9/00* (2006.01)

(52) U.S. Cl.
CPC .......... *B60R 16/0215* (2013.01); *H05K 9/0098* (2013.01)
USPC ...... 174/72 A; 174/74 R; 174/78; 174/102 R; 174/373; 174/360

(58) Field of Classification Search
CPC ........................................................ H02G 3/04
USPC ....... 172/72 A, 103, 84 R, 75 C, 78; 439/579, 439/98; 174/72 A, 103, 84 R, 75 C, 74 R, 174/373, 359, 360, 78, 102 R
See application file for complete search history.

(56) References Cited

U.S. PATENT DOCUMENTS 3,867,565 A * 2/1975 Prentice et al. ......... 174/120 SC
5,257,768 A * 11/1993 Juenemann et al. .......... 248/604
(Continued)

FOREIGN PATENT DOCUMENTS

JP    2004-224156    8/2004
JP    2008-204805    9/2008
(Continued)

*Primary Examiner* — Lisa Lea Edmonds
*Assistant Examiner* — Rashen E Morrison
(74) *Attorney, Agent, or Firm* — Gerald E. Hespos; Michael J. Porco; Matthew T. Hespos

(57) ABSTRACT

Core shield pipes and one collectively encasing braided shield tube are fixed and electrically connected using a metal bracket and a metal clamp. The metal bracket has two semi-circular members formed by dividing a circular plate sized to be covered by the collectively encasing braided shield tube into two parts. Semi-circular pipe insertion grooves are provided side by side at intervals on facing sides of the semi-circular members to face each other and the core shield pipes are inserted respectively into the pipe insertion grooves. The collectively encasing braided shield tube is mounted to cover the outer periphery of the metal bracket formed of the semi-circular members and the metal clamp is fastened to the outer periphery of the collectively encasing braided shield tube.

10 Claims, 7 Drawing Sheets

(56) References Cited

U.S. PATENT DOCUMENTS

| | | | |
|---|---|---|---|
| 5,669,590 A * | 9/1997 | Przewodek | 248/68.1 |
| D390,447 S * | 2/1998 | Colen, Jr. | D8/356 |
| 6,203,376 B1 * | 3/2001 | Magajne et al. | 439/607.44 |
| 6,815,610 B2 * | 11/2004 | Kuboshima et al. | 174/360 |
| 7,384,281 B2 * | 6/2008 | Matsuoka et al. | 439/92 |
| 7,482,538 B2 * | 1/2009 | Kisu et al. | 174/72 A |
| 7,561,445 B2 * | 7/2009 | Yajima et al. | 361/826 |
| 2003/0221850 A1 * | 12/2003 | Mizutani | 174/36 |
| 2004/0099427 A1 * | 5/2004 | Kihira | 174/35 C |
| 2008/0264102 A1 * | 10/2008 | Berra | 63/1.11 |
| 2009/0107694 A1 * | 4/2009 | Watanabe | 174/102 R |
| 2009/0294149 A1 * | 12/2009 | Watanabe et al. | 174/102 R |

FOREIGN PATENT DOCUMENTS

| | | |
|---|---|---|
| JP | 2009-21254 | 1/2009 |
| JP | 2009-135240 | 6/2009 |
| JP | 2010-40396 | 2/2010 |
| WO | WO 2008062885 A1 * | 5/2008 |

* cited by examiner

WIRING HARNESS ARRANGEMENT STRUCTURE

BACKGROUND OF THE INVENTION

1. Field of the Invention

The present invention relates to a wiring harness arrangement structure and particularly designed to electrically connect a plurality of core shield pipes through each of which a wire is inserted and one collectively encasing braided shield tube in which the wires drawn out from the respective core shield pipes are bundled and inserted in a wiring harness arranged in a hybrid vehicle or an electric vehicle.

2. Description of the Related Art

Conventionally, a structure of Japanese Unexamined Patent Publication No. 2004-224156 shown in FIGS. 6(A) and 6(B) has been proposed as an arrangement structure of power cables arranged in a hybrid vehicle or an electric vehicle. In this structure, three power cables (high-voltage cables) 102U, 102V and 102W connected to an inverter 100 installed on a rear side are respectively inserted through the respective core shield pipes (protection pipes) made of metal, arranged to extend forward below a floor, pulled into an engine compartment on a front side and connected to a motor 101 installed in the engine compartment. In the engine compartment, the three power cables 102U, 102V and 102W are collectively inserted into a flexible collectively encasing shield tube (protection tube) 120.

As described above, the power cables 102U, 102V and 102W are respectively inserted through the rigid core shield pipes 110 in a wiring area below the floor and inserted into the flexible collectively encasing shield tube 120 in a wiring area in the engine compartment, thereby enabling the arrangement of the power cables 102U, 102V and 102W below the floor and effective use of a space above the floor.

To maintain a high shield function in the above structure, it is important to reliably electrically connect the plurality of respective core shield pipes 110 to the collectively encasing shield tube 120. However, in the case of using a braided shield tube formed by weaving metal wires in a mesh-like manner as the collectively encasing shield tube 120, the collectively encasing shield tube 120 needs to be mounted to cover the leading end of each core shield pipe 110 and fixed using a crimp ring 130 as shown in FIG. 7. If the collectively encasing shield tube 120 is connected to each of the plurality of core shield pipes 110 using the crimp ring 130 in this way, there is a problem of requiring large numbers of main-hours and parts.

An object of the present invention is to enable easy fixing and electrical connection of a plurality of core shield pipes through each of which a wire is inserted and one collectively encasing braided shield tube in which the wires drawn out from the respective core shield pipes are bundled and inserted using small numbers of man-hours and parts.

SUMMARY OF THE INVENTION

To achieve the above object, the invention is directed to an arrangement structure of a wiring harness arranged in a hybrid vehicle or an electric vehicle, comprising: a first area where each of a plurality of wires is inserted through each of core shield pipes made of metal pipes and a plurality of core shield pipes are arranged proximate to and in parallel to each other; a second area where the plurality of wires drawn out from the respective core shield pipes are inserted into one collectively encasing braided shield tube formed by weaving metal wires in a mesh-like manner; wherein: the plurality of respective core shield pipes in the first area and the one collectively encasing braided shield tube in the second area are fixed and electrically connected using a metal bracket and a metal clamp; the metal bracket is formed of a pair of semi-circular members obtained by dividing a circular plate sized to be covered by the collectively encasing braided shield tube into two parts and pipe insertion grooves formed of semi-circular recesses are respectively provided side by side at intervals on facing sides of the semi-circular members to face each other; and each of the core shield pipes is brought into contact with and inserted into one of the pairs of pipe insertion grooves, and the collectively encasing braided shield tube is fixed and electrically connected to the respective core shield pipes via the metal bracket by the metal clamp by mounting the collectively encasing braided shield tube to cover the outer periphery of the metal bracket formed of the pair of semi-circular members and externally fitting and fastening the metal clamp to the outer periphery of the collectively encasing braided shield tube.

As described above, in the present invention, the metal bracket formed of the pair of semi-circular members formed with the respective pipe insertion grooves which are formed of the semi-circular recesses and arranged at intervals to face each other is used to electrically connect the plurality of respective core shield pipes in the first area and one collectively encasing braided shield tube in the second area. Thus, only by inserting the respective core shield pipes in the first area into the pipe insertion grooves of the semi-circular members and sandwiching the respective core shield pipes by the pair of semi-circular members, the outer peripheries of the plurality of respective inserted core shield pipes can be held in close contact with the metal bracket.

Further, only by mounting the collectively encasing braided shield tube in the second area to cover the metal bracket and externally fitting and fastening the metal clamp to the collectively encasing braided shield tube, the collectively encasing braided shield tube can be held in close contact with the metal bracket.

As just described, according to the above configuration, one collectively encasing braided shield tube can be easily fixed to the plurality of respective core shield pipes via the metal bracket and the plurality of respective core shield pipes and one collectively encasing braided shield tube can be electrically connected by using small numbers of man-hours and parts.

Preferably, the metal clamp is formed of a crimp ring having a ring shape and including a crimping projection on a part thereof and is crimped and fixed after the crimp ring is mounted on the outer periphery of the metal bracket with a leading end part of the collectively encasing braided shield tube sandwiched therebetween.

By using the crimp ring as the metal clamp and crimping the crimping projection of the crimp ring as described above, the collectively encasing braided shield tube and the respective core shield pipes are more strongly fixed, whereby a more reliable electrical connection is possible.

Further, the metal clamp may be formed of a pair of half-ring members, bolt holes may be provided on opposite sides of each half-ring member, and bolts may be inserted into the bolt holes on the opposite sides and fixed by nuts after the pair of half-ring members are mounted on the outer periphery of the metal bracket with a leading end part of the collectively encasing braided shield tube sandwiched therebetween.

Also by using the pair of half-ring members provided with the bolt holes on the opposite sides as the metal clamp and inserting the bolts into the bolt holes of the pair of half-ring members and fixing them by the nuts as described above, the collectively encasing braided shield tube and the respective core shield pipes are more strongly fixed, whereby a more reliable electrical connection is possible.

The pair of semi-circular members of the metal bracket may be separate members, but may be coupled at one end side by a hinge to be openable and closable with respect to each other. By coupling the pair of semi-circular members by the hinge in this way, the respective core shield pipes can be more easily sandwiched by the pair of semi-circular members.

The metal bracket is preferably made of, e.g. aluminum-based metal or copper-based metal, and the metal clamp is preferably made of aluminum-based metal.

Further, the collectively encasing braided shield tube is preferably formed by weaving, for example, copper-based metal wires and the respective core shield pipes are preferably made of aluminum-based metal.

Preferably, the first area is a wiring area below a vehicle floor and the second area is a wiring area in an engine compartment.

Since an area below the vehicle floor is an area where wires can be arranged substantially straight, a vehicle space can be effectively utilized by setting this area as the first area in which a plurality of wires connected to devices on a rear side such as a battery are arranged in parallel by being individually inserted through the respective core shield pipes. On the other hand, since the wires have to be bent in some places in the engine compartment, the interior of the engine compartment is preferably set as the second area where the plurality of wires drawn out from the respective core shield pipes are bundled and inserted into the flexible collectively encasing braided shield tube. The plurality of wires inserted in the collectively encasing braided tube can be connected to devices in the engine compartment such as an inverter.

As described above, in the present invention, the metal bracket formed of the pair of semi-circular members formed with the respective pipe insertion grooves which are formed of the semi-circular recesses and arranged at intervals to face each other is used to electrically connect the plurality of respective core shield pipes in the first area and one collectively encasing braided shield tube in the second area. Thus, only by inserting the respective core shield pipes in the first area into the pipe insertion grooves provided in the semi-circular members and sandwiching the respective core shield pipes by the pair of semi-circular members, the outer peripheries of the plurality of respective inserted shield pipes can be held in close contact with the metal bracket. Further, only by mounting the collectively encasing braided shield tube in the second area to cover the metal bracket and externally fitting and fastening the metal clamp to the collectively encasing braided shield tube, the collectively encasing braided shield tube can be held in close contact with the metal bracket.

As just described, according to the above configuration, one collectively encasing braided shield tube can be easily fixed to the plurality of respective core shield pipes via the metal bracket and the plurality of respective core shield pipes and one collectively encasing braided shield tube can be electrically connected by using small numbers of man-hours and parts.

BRIEF DESCRIPTION OF THE DRAWINGS

FIG. 2 show a connected part between core shield pipes and a collectively encasing braided shield tube, wherein

FIGS. 4(A) and 4(B) show a connected part between core shield pipes and a collectively encasing braided shield tube in a second embodiment, wherein FIG. 4(A) is a schematic perspective view and FIG. 4(B) is a section along B-B.

DETAILED DESCRIPTION OF THE PREFERRED EMBODIMENTS

Hereinafter, embodiments of the present invention are described with reference to the drawings.

Figure 1A:
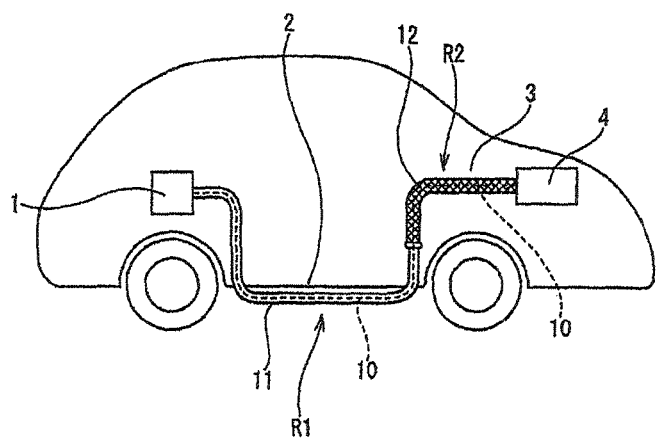
FIG. 1 show an arrangement structure of a wiring harness according to a first embodiment, wherein 1(A) is a schematic diagram showing an arranged state in an automotive vehicle
FIG. 1(B) is a schematic plan view.
Figure 1B:
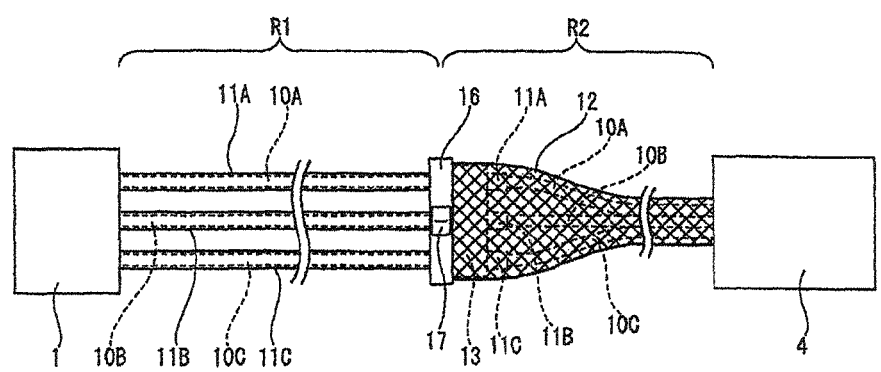
Figure 2A:
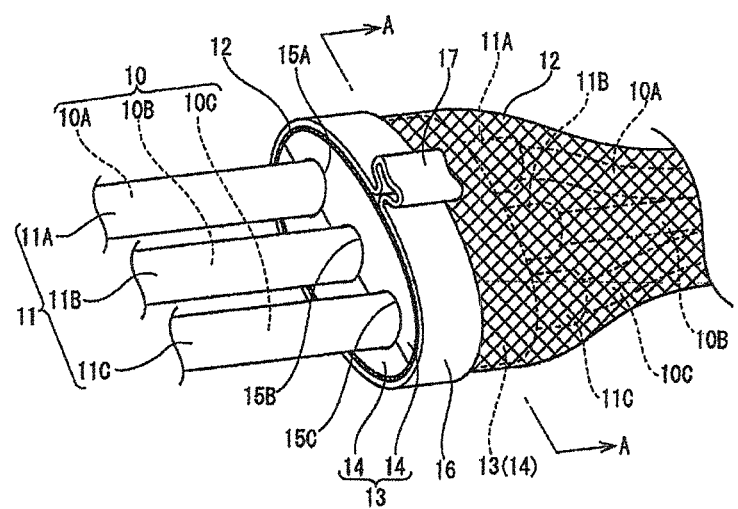
FIG. 2(A) is a schematic perspective view and FIG. 2(B) is a section along A-A.
Figure 2B:
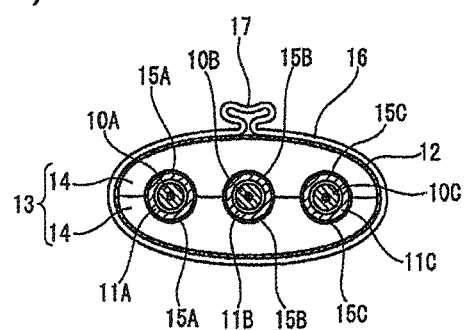
Figure 3:
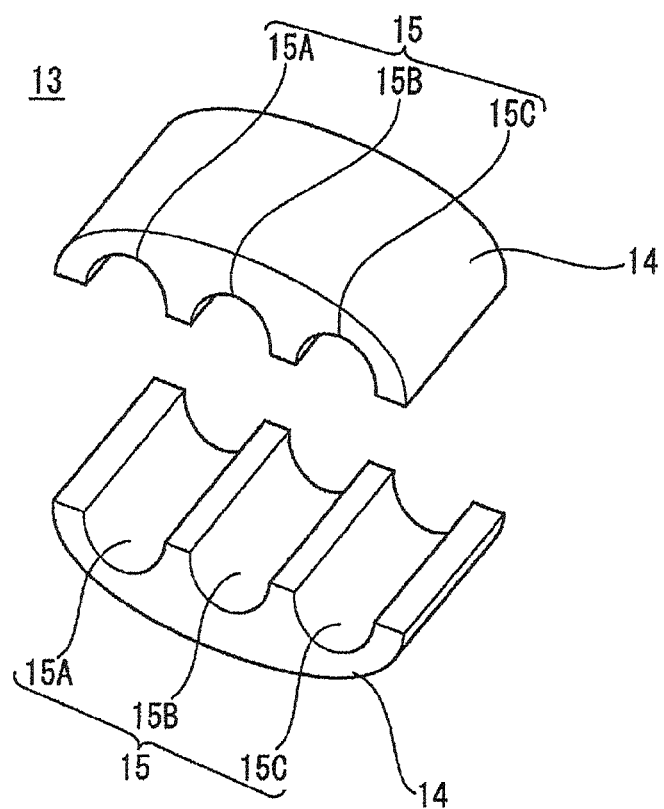
FIG. 3 is a schematic exploded perspective view showing a metal bracket.

FIGS. 1 to 3 show a first embodiment of the present invention. In this embodiment, a wiring harness is arranged to connect a battery 1 installed on a rear side and an inverter 4 installed in an engine compartment 3 in a hybrid vehicle as shown in FIG. 1. Three wires 10 (10A, 10B, 10C) forming the wiring harness are connected to the battery 1 on the rear side, arranged below a floor 2 and connected to the inverter 4 in the engine compartment 3.

A wiring area for the wiring harness is composed of a first area R1 where the wiring harness is arranged from the rear side below the floor 2 and pulled into the engine compartment 3 on a front side and a second area R2 which is continuous with the first area R1 and where the wiring harness is arranged in the engine compartment 3. In the first area R1, as shown in FIG. 1(B), the three wires 10 (10A, 10B, 10C) are individually inserted through core shield pipes 11 (11A, 11B, 11C) made of aluminum metal pipes and these respective core shield pipes 11 (11A, 11B, 11C) are arranged proximate to and in parallel to each other. On the other hand, in the second area R2, the three wires 10 (10A, 10B, 10C) drawn out from the three respective core shield pipes 11 (11A, 11B, 11C) are bundled and inserted into one collectively encasing braided shield tube 12 formed by weaving copper-based metal wires in a mesh-like manner. Note that, although not shown, a corrugated tube is mounted on the collectively encasing braided shield tube 12 in the second area R2.

At a boundary position between the first and second areas R1, R2, a leading end part of the one collectively encasing braided shield tube 12 needs to be fixed and electrically connected to leading end parts of the three respective core shield pipes 11 (11A, 11B, 11C) and, in this embodiment, is fixed using a metal bracket 13 and a metal clamp 16 made of aluminum-based metal. As shown in FIGS. 2 and 3, the metal bracket 13 is formed of a pair of semi-circular members 14 obtained by dividing a circular plate sized to be covered by the collectively encasing braided shield tube 12 into two parts, and three pipe insertion grooves 15 (15A, 15B, 15C) formed of semi-circular recesses are provided side by side at intervals on facing sides of these semi-circular members 14 to face each other.

Further, the metal clamp 16 is a ring-shaped crimp ring as shown in FIG. 2 and a crimping projection 17 is provided on a part thereof.

To fix and electrically connect the leading end part of the collectively encasing braided shield tube 12 to the leading end parts of the respective three core shield pipe 11 (11A, 11B, 11C), the leading end part of each of the core shield pipe 11 (11A, 11B, 11C) is brought into contact with and inserted into one of the pairs of the pipe insertion grooves 15 (15A, 15B, 15C) provided in the semi-circular members 14 of the metal bracket 13 and sandwiched by the pair of semi-circular members 14 of the metal bracket 13.

Subsequently, the wires 10 (10A, 10B, 10C) drawn out from the leading ends of the respective core shield pipes 11 (11A, 11B, 11C) toward the second area (R2) are bundled and inserted into the collectively encasing braided shield tube 12 and the leading end part of the collectively encasing braided shield tube 12 on the first area (R1) side is mounted to cover the outer periphery of the metal bracket 13.

Finally, after the metal bracket 16 made of a crimp ring is mounted on the outer periphery of the metal bracket 13 to sandwich the leading end part of the collectively encasing braided shield tube 12, the crimping projection 17 of the metal clamp 16 is crimped and fixed. In this way, the fixing of the respective three core shield pipes 11 (11A, 11B, 11C) and the one collectively encasing braided shield tube 12 is completed.

As described above, the metal bracket 13 formed of the pair of semi-circular members 14 in which the respective pipe insertion grooves 15 (15A, 15B, 15C) formed of semi-circular recesses are arranged at intervals to face each other is used in this embodiment. Thus, only by inserting the leading end parts of the respective core shield pipes 11 (11A, 11B, 11C) in the first area (R1) into the respective pipe insertion grooves 15 (15A, 15B, 15C) of the semi-circular members 14 and sandwiching the respective core shield pipes 11 (11A, 11B, 11C) by the pair of semi-circular members 14, the outer peripheries of the leading end parts of the respective core shield pipes 11 (11A, 11B, 11C) can be brought into close contact with the metal bracket 13.

Further, only by mounting the leading end part of the collectively encasing braided shield tube 12 in the second area R2 to cover the metal bracket 13 and externally fitting and fastening the metal clamp 16 formed of a crimp ring to the outer periphery of the collectively encasing braided shield tube 12, the leading end part of the collectively encasing braided shield tube 12 can be held in close contact with the metal bracket 13.

As just described, according to the above configuration, the leading end part of the collectively encasing braided shield tube 12 can be easily fixed to the leading end parts of the respective three core shield pipes 11 (11A, 11B, 11C) via the metal bracket 13 and the respective three core shield pipes 11 (11A, 11B, 11C) and one collectively encasing braided shield tube 12 can be electrically connected using small numbers of man-hours and parts.

Figure 4A:
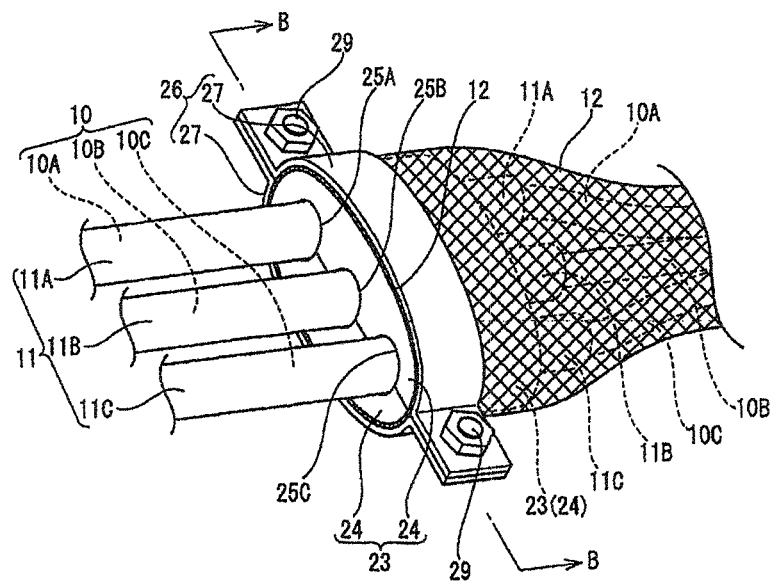
Figure 4B:
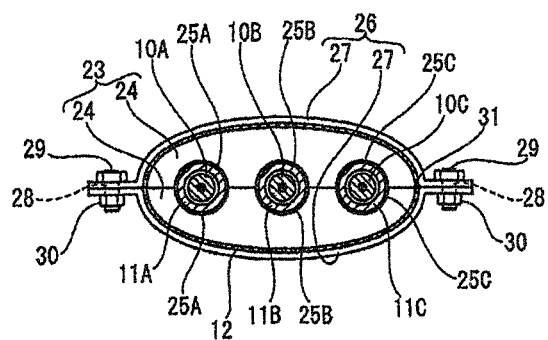
Figure 5:
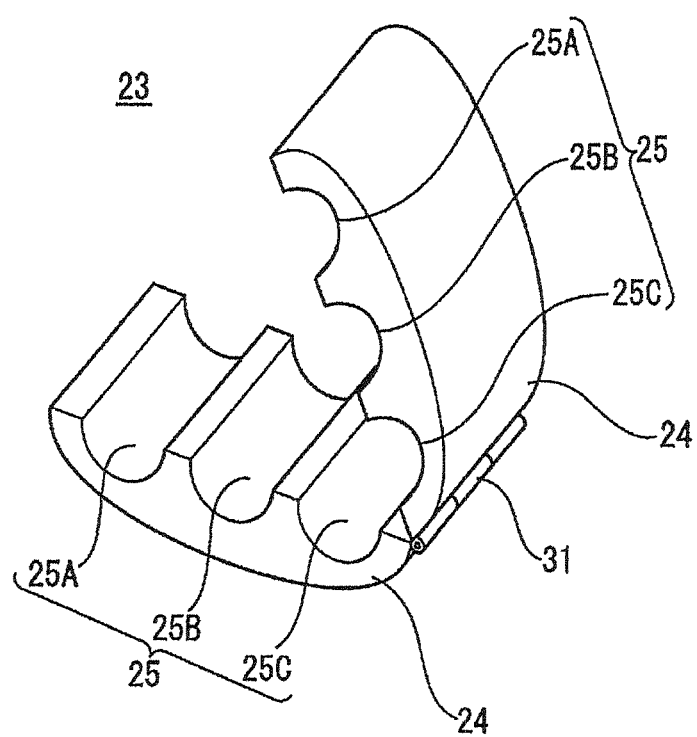
FIG. 5 is a schematic perspective view showing a metal bracket used in the second embodiment (when the metal bracket is open).
Figure 6A:
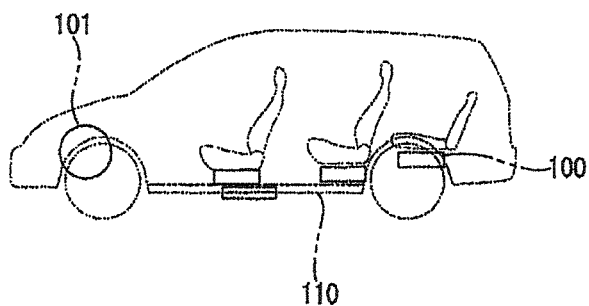
FIG. 6 are diagrams showing a prior art.
Figure 6B:
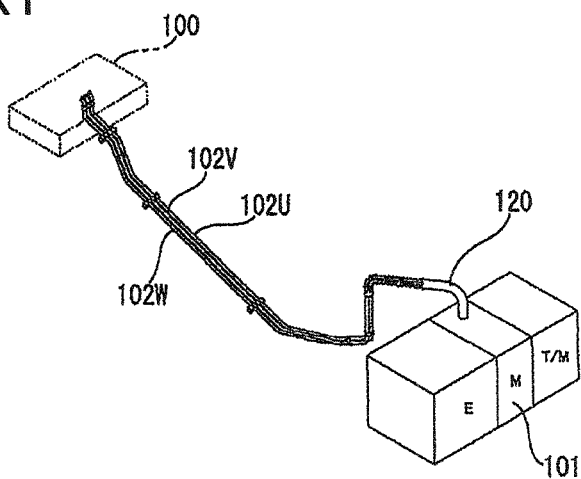
Figure 7:
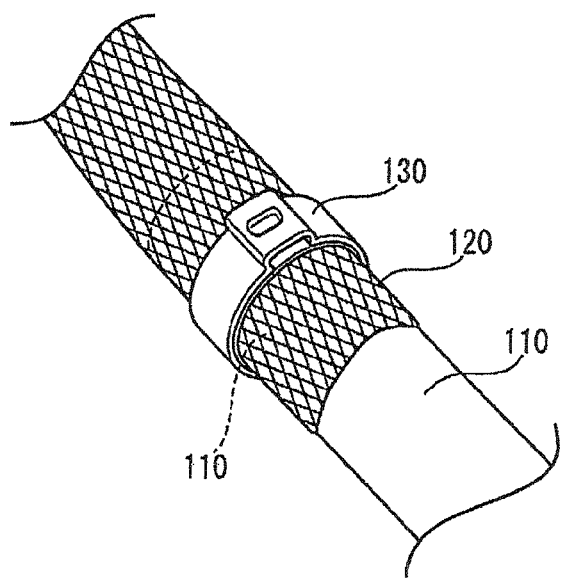
FIG. 7 is a diagram showing the prior art.

FIGS. 4 and 5 show a second embodiment.

In the second embodiment, as shown in FIG. 4, a metal clamp 26 is formed of a pair of half-ring members 27 each formed with bolt holes 28 on opposite sides and can be fastened by inserting bolts 29 into the bolt holes 28 and fixing them by nuts 30. Further, as shown in FIG. 5, the pair of semi-circular members 24 of the metal bracket 23 are coupled at one end side by a hinge 31 and openable and closable with respect to each other. Other points are the same as in the first embodiment.

Also in the second embodiment, it is possible to easily fix and electrically connect a leading end part of one collectively encasing braided shield tube 12 to leading end parts of three core shield pipes 11 (11A, 11B, 11C) via the metal bracket 23 as in the first embodiment.

The invention claimed is:

1. An arrangement structure of a wiring harness arranged in a hybrid vehicle or an electric vehicle, comprising:
   a first area where each of a plurality of wires is inserted respectively through each of plurality of metal core shield pipes arranged proximate to one another and parallel to each other;
   a second area where the plurality of wires drawn out from the respective core shield pipes are inserted into one collectively encasing braided shield tube formed by weaving metal wires in a mesh-like manner;
   a metal bracket formed from two semi-circular members positioned in opposed relationship to one another, each of the semi-circular members being a metal plate having an inner diametrical edge with semi-circular pipe insertion grooves provided side by side at intervals, the diametrical edges of the semi-circular members abutting each other and the semi-circular pipe engaging grooves respectively engaging the metal core shield pipes, each of the semi-circular members further having a single continuously convex outer arcuate edge configured to define a single continuous convex arcuate outer peripheral surface extending around the bracket when the diametrical edges are abutting, the single continuous convex arcuate outer peripheral surface being sized to be covered by the collectively encasing braided shield tube, the metal plate of each of the semi-circular members being continuous at all locations from the outer semi-circular edge to the inner diametrical edge and semi-circular pipe insertion grooves; and
   a clamp keeping the collectively encasing braided shield tube fixed and electrically connected to the continuous convex arcuate outer peripheral surface extending around the metal bracket, keeping the diametrical edges of the semi-circular members in abutting contact with one another and keeping the semi-circular pipe engaging grooves fixed and electrically connected to the respective core shield pipes.

2. The arrangement structure of claim 1, wherein the clamp is a metal crimp ring having a crimping projection on a part thereof and being crimped and fixed after the crimp ring is mounted on the outer periphery of the metal bracket with a leading end part of the collectively encasing braided shield tube sandwiched therebetween.

3. The arrangement structure of claim 1, wherein the clamp is formed of a pair of half-ring members, bolt holes are provided on opposite sides of each half-ring member, and bolts are inserted into the bolt holes on the opposite sides and fixed by nuts after the pair of half-ring members are mounted on the outer periphery of the metal bracket with a leading end part of the collectively encasing braided shield tube sandwiched therebetween.

4. The arrangement structure of claim 3, wherein the semi-circular members of the metal bracket are coupled at one side by a hinge to be openable and closable with respect to each other.

5. The arrangement structure of claim 4, wherein the first area is below a vehicle floor and the second area is in an engine compartment.

6. The arrangement structure of claim 1, wherein the semi-circular members of the metal bracket are coupled at one side by a hinge to be openable and closable with respect to each other.

7. The arrangement structure of claim 2, wherein the semi-circular members of the metal bracket are coupled at one end side by a hinge to be openable and closable with respect to each other.

8. The arrangement structure of claim 1, wherein the first area is below a vehicle floor and the second area is in an engine compartment.

9. The arrangement structure of claim 2, wherein the first area is below a vehicle floor and the second area is in an engine compartment.

10. The arrangement structure of claim 3, wherein the first area is below a vehicle floor and the second area is in an engine compartment.

* * * * *